United States Patent [19]

Ha

[11] Patent Number: 5,373,510
[45] Date of Patent: Dec. 13, 1994

[54] TEST CIRCUIT OF INPUT ARCHITECTURE OF ERASABLE AND PROGRAMMABLE LOGIC DEVICE

[75] Inventor: Chang W. Ha, Geumjeong-Ku, Rep. of Korea

[73] Assignee: Hyundai Electronics Co., Ltd., Kyoungkido, Rep. of Korea

[21] Appl. No.: 766,429

[22] Filed: Sep. 25, 1991

[30] Foreign Application Priority Data

Sep. 28, 1990 [KR] Rep. of Korea ............... 1990-15562

[51] Int. Cl.$^5$ .................. H04B 17/00; G06F 9/00
[52] U.S. Cl. ............................. 371/22.2; 371/22.1; 364/965.76
[58] Field of Search ............... 371/22.2, 22.1; 364/244.2, 244.6, 244.9, 965, 965.1, 965.2, 965.76; 395/575

[56] References Cited

U.S. PATENT DOCUMENTS

| | | | |
|---|---|---|---|
| 4,393,474 | 6/1983 | McElroy | 371/10.3 |
| 4,609,986 | 9/1986 | Hartmann et al. | 395/800 |
| 4,617,479 | 10/1986 | Hartman et al. | 395/800 |
| 4,713,792 | 12/1987 | Hartman et al. | 364/900 |
| 4,749,947 | 6/1988 | Gheewala | 371/15 |
| 4,972,144 | 11/1990 | Lyon et al. | 371/226 |

*Primary Examiner*—Robert W. Beausoliel, Jr.
*Assistant Examiner*—Trinh Tu
*Attorney, Agent, or Firm*—Darby & Darby

[57] ABSTRACT

In accordance of the invention, the Erasable and Programmable Logic Device comprising a test circuit of the input architectures is provided.

The test circuit comprises an extra test line 39, a plurality of EPROM transistors 34 having respectively the drain thereof connected to the extra test line and the gate thereof connected to a true input line provided from said one input architecture, sensing means 36 connected to the extra test line for sensing the state of the extra test line, and a buffer circuit 37 connected to the sensing means.

4 Claims, 4 Drawing Sheets

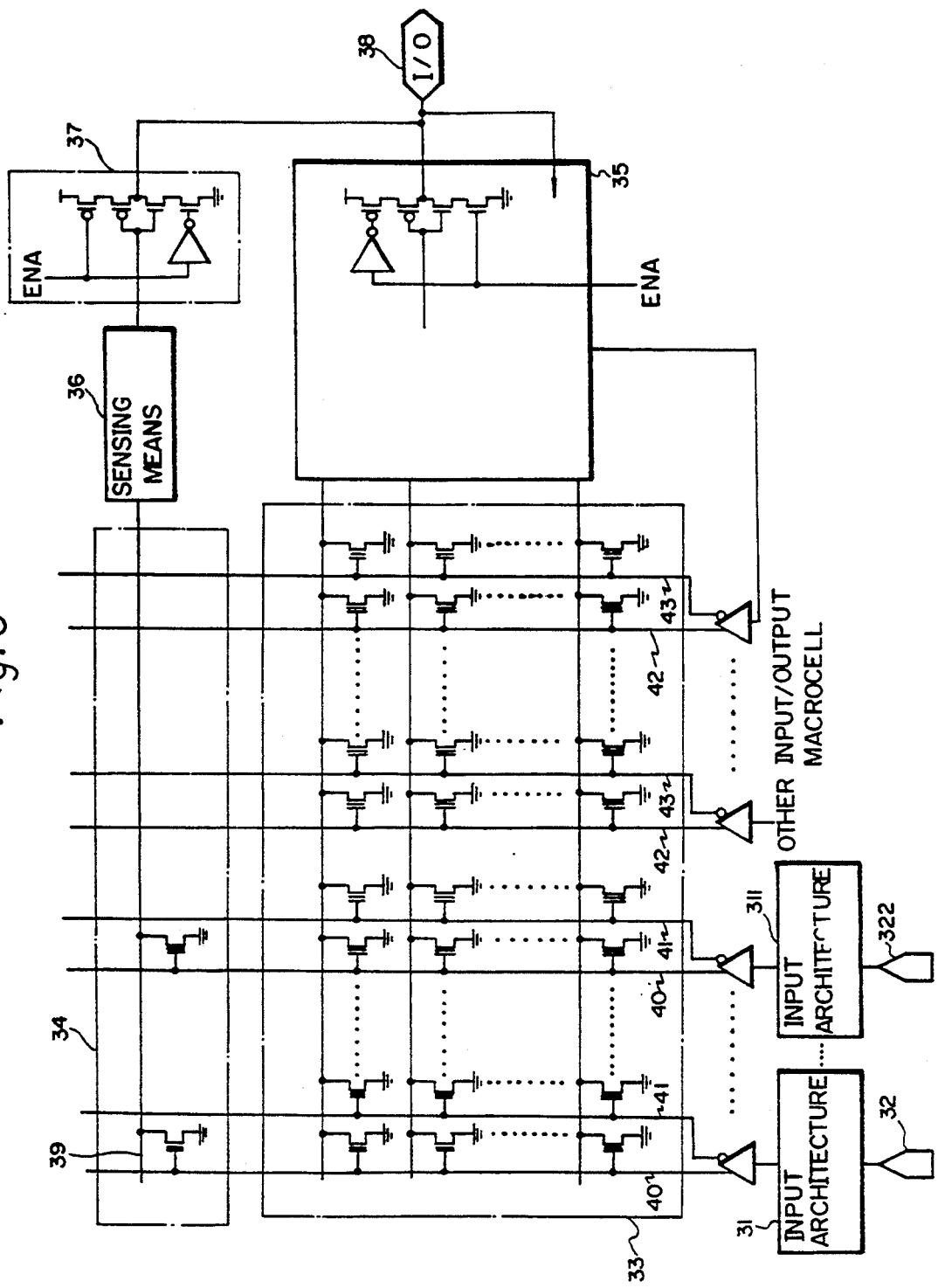

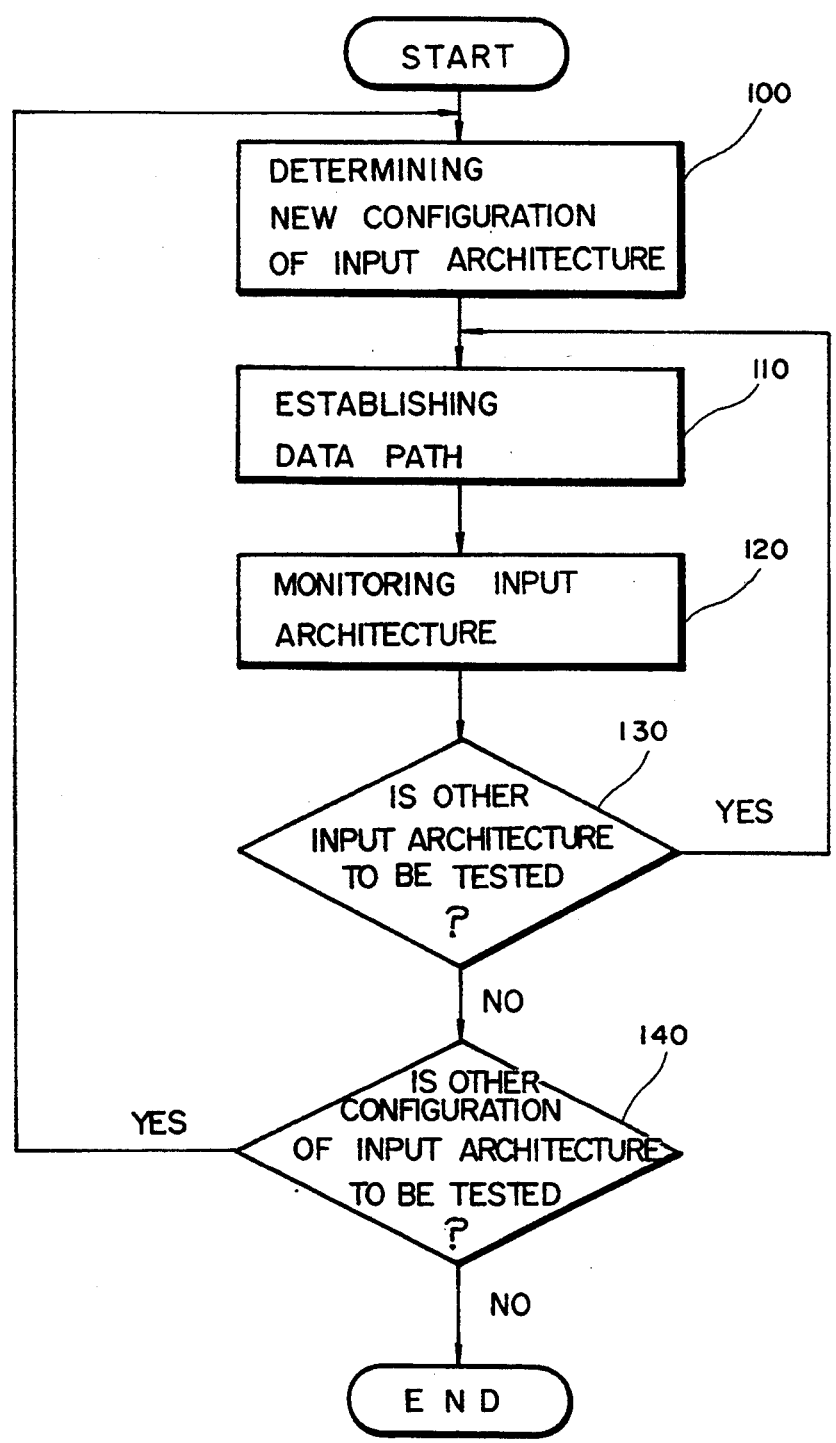

TEST CIRCUIT OF INPUT ARCHITECTURE OF ERASABLE AND PROGRAMMABLE LOGIC DEVICE

BACKGROUND OF THE INVENTION

This invention relates to a test circuit of input architecture for Erasable and Programmable Logic Device.

The Erasable and Programmable Logic Device (hereinafter referred to as EPLD) made by the Erasable Programmable Read Only Memory(EPROM) technology has been widely used, and EPLD array architecture was disclosed in U.S. Pat. No. 4,609,986. This input architecture is a transparent latch and can form input data into flow through data or into latched data. There are two types of input architecture, one of flow through architecture, the other of user configurable logic. The input architecture of the user configurable logic is generally composed of flow through architecture, flip-flop architecture, or latch architecture. However, this architecture doesn't have a test function for testing just the input architecture of the user configurable logic.

SUMMARY OF THE INVENTION

It is an object of the invention to provide a test circuit for testing just the input architecture of the user configurable logic and for outputting the test result to an output pin.

In accordance of the invention, the Erasable and Programmable Logic Device comprising a test circuit of the input architectures is provided.

The test circuit comprises an extra test line, a plurality of EPROM transistors having respectively the drain thereof connected to the extra test line and the gate thereof connected to a true input line provided from said one input architecture, sensing means connected to the extra test line for sensing the state of the extra test line, and a buffer circuit connected to the sensing means.

DESCRIPTION OF THE DRAWINGS

For a more complete understanding of the present invention and for further objects and advantages thereof, reference is now made to the following description taken in conjunction with the accompanying drawings, in which:

FIG. 3 is a schematic diagram of the EPLD;

FIG. 4 is a flow chart for explaining an operation of this invention.

DESCRIPTION OF THE PREFERRED EMBODIMENT

Figure 1:
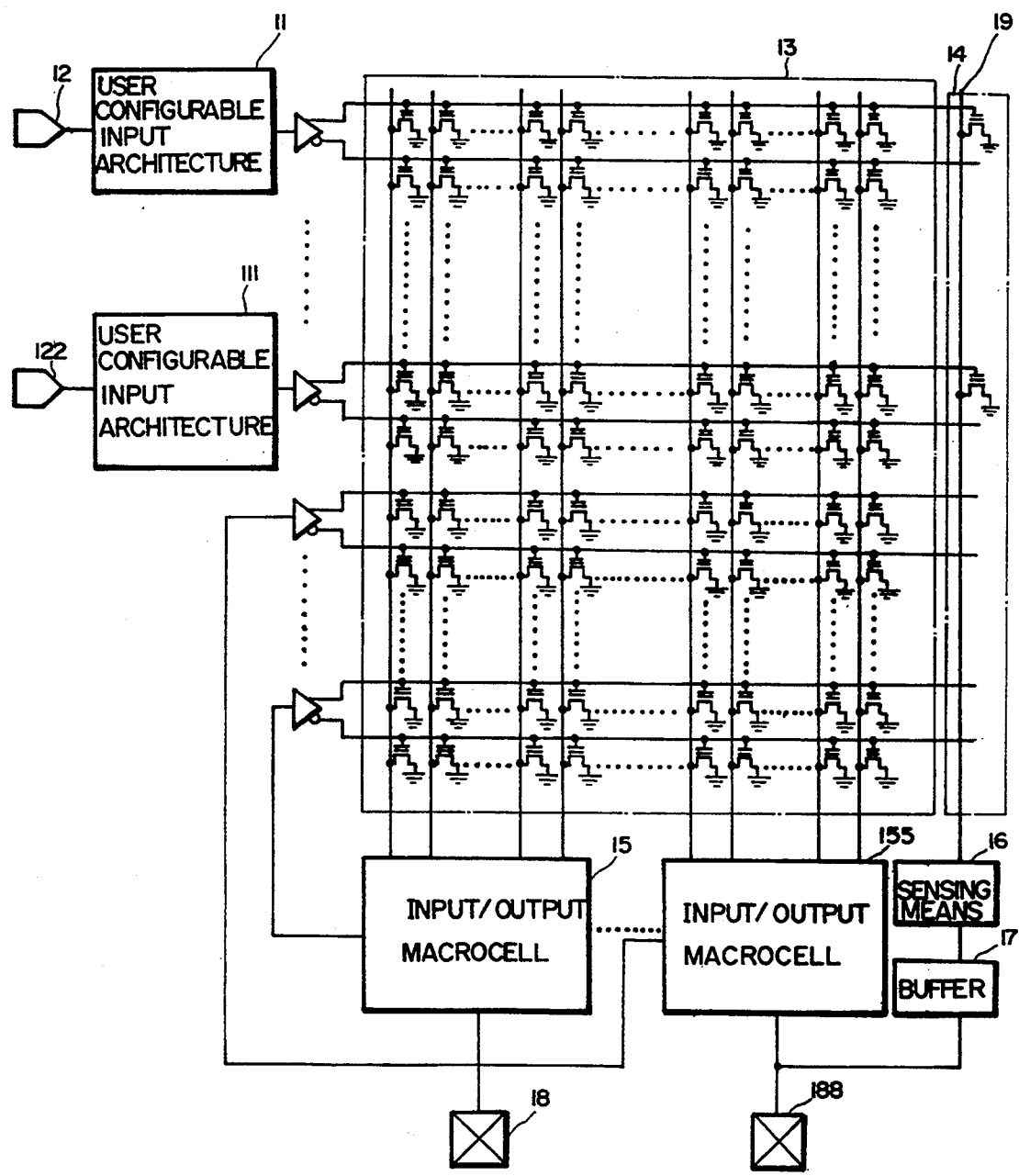
FIG. 1 is a construction diagram of EPLD which the test circuit is applied.

FIG. 1 is a construction diagram of EPLD(Erasable and Programmable Logic Device) which the test circuit of this invention is applied. This invention comprises a plurality of EPROM(Erasable Programmable Read Only Memory) transistors 14 which the gates thereof are connected to the gate input line of the Programmable "AND" Memory Array 13 and the drains thereof are connected to an extra test line 19, sensing means 16 which are connected to the extra test line 19, and a test data output enable buffer 17 which is connected to the sensing means 16.

The Programmable "AND" Memory Array 13 is connected to true output lines and inverted output lines provided from the user configurable input architecture, and receives input signals through that lines and then transmits output signals through memory cells to input/output macrocells 15 and 155.

The user configurable input architectures 11 and 111 send the input data transmitted from the input pins 12 and 122, to the Programmable "AND" Memory Array 13, in any form of flow-through data, latched data and registered data.

The reference numbers 18 and 188 show I/O(Input/Output) pins.

Figure 2:
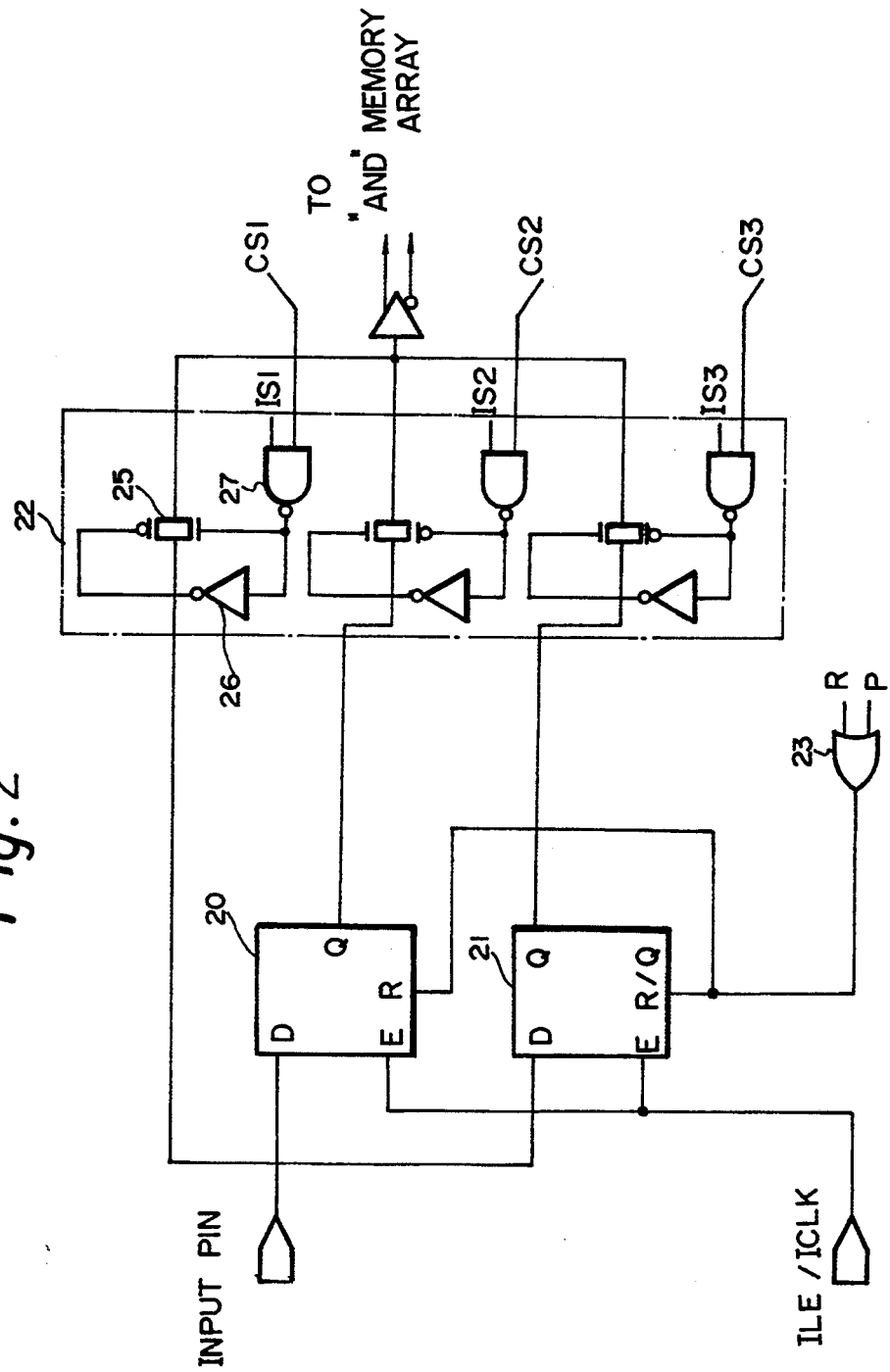
FIG. 2 is an embodiment view of the user configurable input architecture.

FIG. 2 shows one embodiment of the user configurable input architecture of FIG. 1.

In FIG. 2, the data path form is determined according to the terminals IS1, IS2 and IS3 controlled by external pins(not shown). The user configurable input architectures 11 and 111 of which data path is determined according to the terminals IS1, IS2 and IS3, receives data signals from the input pins 12 and 122 and then applies that signals to the gates of the EPROM transistors 14 respectively. And also the user configurable input architecture 11 or 111 has a certain form of input architecture according to the control signals CS1, CS2 and CS3 controlled by external EPROM transistors(not shown).

That is, in case that all EPROM transistors are erased, the input architecture has flow-through form, in case that the first and the second EPROM transistors are programmed, the input architecture has D-latch form, and in case that the first and the third EPROM transistors are programmed, the input architecture has D-Flip-Flop 21 form.

An asynchronous reset product term(P) signal and a power-on reset signal(R) are logic-summed through OR gate 23, and the OR gate 23 is connected to the reset terminals of the D flip-flops 20 and 21. Therefore when the power turns ON or the user implements a certain logic in the Programmable "AND" memory asynchronously, the input architecture can be resetted.

ILE/ICLK terminal performs a function of control clock.

The outputs of the input architecture are shown at the following table 1.

TABLE 1

| Input Form | ILE/ICLK | D | Qn + 1 |
| --- | --- | --- | --- |
| Flow-Through | X | H | H |
| Flow-Through | X | L | L |
| Latch | H | H | H |
| Latch | H | L | L |
| Latch | L | X | Qn |
| D Flip-Flop | ◢ | H | H |
| D Flip-Flop | ◢ | L | L |

In case that the input architectures are tested, the control signals CS1, CS2 and CS3 are controlled as a high level, and therefore the data path form of the input architecture is determined according to the terminals IS1, IS2 and IS3 controlled by external pins(not shown).

FIG. 3 is a schematic diagram of the EPLD which the test circuit of this invention is applied.

The EPROM transistors 34 have respectively the drain thereof connected to the extra test line 39 and the gate thereof connected to the true input line 40 outputted from the input architecture 31 or 311. This EPROM transistors 34 are not connected to the true input line 42 and the inverted input line 43 provided from the feedback line of the Input/Output macrocell 35.

The sensing means 36 are connected to the extra test line 39 and sense the state of the extra test line 39. The sensed result is transmitted to the I/O pin 38 through the test data output enable buffer circuit 37. Said testing procedure is applied over again for all the data path forms of the input architecture. In the Input/Output macrocell 35 and the test data output enable buffer circuit 37, a control signal(ENA) is applied in order to transmit their outputs to one I/O pin 38.

That is, in case that the control signal (ENA) is controlled as a low level, the data from the sensing means 36 are outputted to the I/O pin 38 through the test data enable buffer circuit 37. At this time, the data from the Input/Output macrocell are not outputted to the I/O pin 38. On the other hand, in case that the control signal (ENA) is controlled as a high level, the data from the Input/Output macrocell 35 are outputted to the I/O pin 38.

FIG. 4 is a flow chart for a test method of the EPLD input architecture.

In the first step 100 and 110, as described above, the control signals CS1, CS2 and CS3 controlled by the EPROM transistors (not shown) are controlled as a high level, the input data form of the input architecture is determined according to the control signals CS1, CS2 and CS3, and then the terminal signals IS1, IS2 and IS3 are inputted in order to establish the data path corresponding to that input data form.

In the second step 120, only the input pin of the input architecture corresponding to the established data path turns to the active state, and said input architecture is monitored by sensing the extra test line, and then the sensed result is outputted to the I/O pin through the test output enable buffer circuit.

In the third step 130, in case that other input architecture to be tested exists, such input architecture is monitored by repeating said way, exchanging the input pin of active state.

In the fourth step 140, in case that other configuration of the input architecture to be tested exists, such input architecture is monitored by repeating said steps, exchanging configuration of the input architecture.

What is claimed is:

1. In an Erasable and Programmable Logic Device comprising a plurality of input architectures for transmitting input data with a certain configuration type of the input architecture, a plurality of input lines provided from the input architectures, a Programmable Logic Array connected to the input lines, and an Input/Output Macrocell connected between the Programmable Logic Array and an input/output pin, the improvement comprising a test circuit of the input architectures comprising:

an extra test line;
   a plurality of EPROM (Erasable Programmable Read Only Memory) transistors each having respectively a drain thereof connected to the extra test line and a gate thereof connected to an input line provided from one of said input architectures;
   sensing means connected to the extra test line, for sensing a state of the extra test line and producing a transmitted signal representing the state of the extra test line; and
   a buffer circuit connected to the sensing means, for outputting the transmitted signal from the sensing means to the Input/Output pin.

2. An Erasable and programmable Logic Device according to claim 1, wherein the Programmable Logic Array comprises a plurality of EPROM(Erasable Programmable ROM) transistors.

3. An Erasable and Programmable Logic Device according to claim 2, wherein the EPROM transistors connected to the extra test line are always in an erased state.

4. An Erasable and Programmable Logic Device according to claim 3, wherein the input architectures can form one path of a flow-through path, a latched path and a flip-flop function path.

* * * * *